(12) United States Patent
Liu

(10) Patent No.: US 10,141,346 B2
(45) Date of Patent: Nov. 27, 2018

(54) THIN FILM TRANSISTOR, MANUFACTURING METHOD THEREOF AND LIQUID CRYSTAL DISPLAY

(71) Applicant: Shenzhen China Star Optoelectronics Technology Co., Ltd., Shenzhen, Guangdong (CN)

(72) Inventor: Xun Liu, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 187 days.

(21) Appl. No.: 15/108,523

(22) PCT Filed: Apr. 14, 2016

(86) PCT No.: PCT/CN2016/079247
§ 371 (c)(1),
(2) Date: Jun. 27, 2016

(87) PCT Pub. No.: WO2017/166336
PCT Pub. Date: Oct. 5, 2017

(65) Prior Publication Data
US 2018/0102380 A1  Apr. 12, 2018

(30) Foreign Application Priority Data
Mar. 28, 2016 (CN) .......................... 2016 1 0182409

(51) Int. Cl.
| H01L 29/66 | (2006.01) |
| H01L 29/417 | (2006.01) |
| H01L 29/786 | (2006.01) |
| H01L 29/49 | (2006.01) |
| H01L 27/12 | (2006.01) |

(Continued)

(52) U.S. Cl.
CPC .......... *H01L 27/124* (2013.01); *G02F 1/1368* (2013.01); *G02F 1/136227* (2013.01);
(Continued)

(58) Field of Classification Search
CPC ........... H01L 29/41733; H01L 29/4908; H01L 29/7869; H01L 29/41725; G02F 1/136227
See application file for complete search history.

(56) References Cited

U.S. PATENT DOCUMENTS

2011/0168997 A1* 7/2011 Lee ..................... H01L 27/1225
257/57
2012/0199819 A1* 8/2012 Ohsawa .............. H01L 51/5284
257/40
(Continued)

FOREIGN PATENT DOCUMENTS

CN   102194831 A   9/2011
CN   103928530 A   7/2014
(Continued)

*Primary Examiner* — Mohsen Ahmadi
(74) *Attorney, Agent, or Firm* — Andrew C. Cheng

(57) ABSTRACT

The present invention discloses a thin film transistor, a liquid crystal display and the manufacturing method of a thin film transistor. The thin film transistor includes a substrate, a gate electrode formed on the surface of the substrate; a gate insulting layer covered on the gate electrode; a semiconductor layer disposed on the surface of the gate insulating layer and corresponding to the gate electrode; an etching stop layer covered the semiconductor layer and having a first through hole and a second through hole; a passivation layer covered the etching stop layer having a third through hole and a fourth through hole; a source electrode disposed on the passivation layer and connected to the semiconductor layer via the first and the third through hole; and a drain electrode disposed on the passivation layer and connected to the semiconductor layer via the second and the fourth through hole.

12 Claims, 6 Drawing Sheets

(51) Int. Cl.
    *G02F 1/1362* (2006.01)
    *G02F 1/1368* (2006.01)
(52) U.S. Cl.
    CPC .... *G02F 1/136286* (2013.01); *H01L 27/1214* (2013.01); *H01L 27/1262* (2013.01); *H01L 29/41733* (2013.01); *H01L 29/66969* (2013.01); *H01L 29/786* (2013.01); *H01L 29/78606* (2013.01); *G02F 2201/123* (2013.01); *H01L 27/1225* (2013.01); *H01L 29/41725* (2013.01); *H01L 29/4908* (2013.01); *H01L 29/7869* (2013.01)

(56) References Cited

U.S. PATENT DOCUMENTS

| | | | | |
|---|---|---|---|---|
| 2013/0264564 | A1* | 10/2013 | Park | H01L 29/7869 257/43 |
| 2014/0138772 | A1 | 5/2014 | Na et al. | |
| 2015/0214373 | A1* | 7/2015 | Zhang | H01L 29/7869 257/72 |
| 2015/0214375 | A1* | 7/2015 | Hara | H01L 29/78606 257/43 |
| 2015/0348996 | A1* | 12/2015 | Qin | H01L 27/1214 257/43 |
| 2016/0027919 | A1* | 1/2016 | Chung | H01L 27/1214 257/43 |
| 2016/0300861 | A1* | 10/2016 | Xiao | H01L 27/1225 |
| 2016/0336359 | A1* | 11/2016 | Wang | H01L 27/1225 |
| 2016/0380113 | A1* | 12/2016 | Kang | H01L 29/78678 349/139 |

FOREIGN PATENT DOCUMENTS

| | | |
|---|---|---|
| CN | 104465785 A | 3/2015 |
| CN | 104716166 A | 6/2015 |
| CN | 105047611 A | 11/2015 |

\* cited by examiner

THIN FILM TRANSISTOR, MANUFACTURING METHOD THEREOF AND LIQUID CRYSTAL DISPLAY

CROSS REFERENCE

This application claims the priority of Chinese Patent Application No. 201610182409.9, entitled "THIN FILM TRANSISTOR, MANUFACTURING METHOD THEREOF AND LIQUID CRYSTAL DISPLAY", filed on Mar. 28, 2016, the disclosure of which is incorporated herein by reference in its entirety.

FIELD OF THE INVENTION

The present invention relates to a display technology field, and more particularly to a thin film transistor, manufacturing method thereof and liquid crystal display.

BACKGROUND OF THE INVENTION

A liquid crystal display apparatus, such as a liquid crystal display, LCD is commonly used electronic equipment, due to its low power consumption, small size, light weight and other characteristics, so is adapted by users. A liquid crystal display generally includes an array substrate; the array substrate includes a plurality of thin film transistors, TFT distributed as array type. The quality of the thin film transistor directly affects the quality of the liquid crystal display panel. The thin film transistor includes etching stop layer in the conventional technology. The preparation of the etching stop layer typically requires to deposit the etching stop material that can stop etch on the entire layer, and then process the photomask is used, to etch partial of the entire layer of the etching stop material as the etching stop layer to cover partial of the active layer. Then a metal layer is covered on the etching stop layer and the metal layer is patterned to form a source and a drain electrodes. The etching stop layer can prevent the etchant to etch the active layer in the subsequent preparation of the source and the drain of the thin film transistor. However, one more photoresist process is the need in the patterning process of the etching stop layer of the conventional technology, so that the thin film transistor manufacturing process is more complicated.

SUMMARY OF THE INVENTION

The present application provides a thin-film transistor, including:
a substrate;
a gate electrode formed on the surface of the substrate;
a gate insulting layer covered on the gate electrode;
a semiconductor layer disposed on the surface of the gate insulating layer away from the gate electrode and corresponding to the gate electrode;
an etching stop layer covered the semiconductor layer, and the etching stop layer having a first through hole and a second through hole, wherein the first through hole and the second through hole are set corresponding to the semiconductor layer to expose partial of the semiconductor layer, and the first through hole and the second through hole are set in intervals;
a passivation layer covered the etching stop layer, the passivation layer having a third through hole and a fourth through hole wherein the third through hole is corresponding to the first through hole and is in communication with the first through hole; the fourth through hole is corresponding to the second through hole and is in communication with the second through hole;
a source electrode disposed on the passivation layer and connected to one terminal of the semiconductor layer via the first through hole and the third through hole; and
a drain electrode disposed on the passivation layer and in intervals with the source electrode and connected to the other terminal of the semiconductor layer via the second through hole and the fourth through hole.

Wherein the thin-film transistor further including:
a pixel electrode formed on the passivation layer, and the pixel electrode is electrically connected to the drain electrode and the pixel electrode is integrally formed with the drain electrode.

Wherein the thin-film transistor further including:
a data line formed between the etching stop layer and the passivation layer;
the passivation layer further including a fifth through hole, the fifth through hole is set corresponding to the data line to expose partial of the data line; and
the data line is electrically connected to the source electrode via the fifth through hole.

Wherein the gate electrode including a first surface, a second surface and a third surface, the first surface is disposed on the substrate, the second surface disposed opposite the third surface, the second surface is intersected with the first surface, the third surface is intersected with the first surface and the third surface is away from the data line compared to the second surface; and the surface of the data line adjacent to the third through hole has a gap or coplanar with the second surface of the gate electrode.

Wherein the data line is set on the side closer to the first through hole and away from the second through hole, and the data line and the first through hole is set in intervals; and the fifth through hole is set on the side closer to the third through hole and away from the fourth through hole, and the fifth through hole and the third through hole is set in intervals.

Wherein the fifth through hole is set on the side closer to the third through hole.

The present application further provides a method for manufacturing a thin-film transistor, including:
providing a substrate;
depositing a first metal layer on the surface of the substrate and pattering the first metal layer to form a gate electrode;
forming a gate insulating layer on and covering the gate electrode;
depositing a layer of semiconductor material on the surface of the gate insulating layer away from the surface of the gate electrode, and the semiconductor material is patterned to form a semiconductor layer corresponding to the gate electrode;
depositing an etching stop layer on the surface of the semiconductor layer away from the gate insulating layer;
depositing a passivation layer on the surface of the etching stop layer away from the semiconductor layer;
separately etching the etching stop layer and the passivation layer corresponding to two terminals of the semiconductor layer to form through holes and expose the two terminals of the semiconductor layer; the first through hole and the second through hole are formed in the etching stop layer corresponding to the two terminals of the semiconductor layer; the third through hole on the passivation layer is corresponding and connect to the first through hole; and the fourth through hole on the passivation layer is corresponding and connect to the second through hole;

depositing a transparent conductive layer on the surface of the passivation layer away from the etching stop layer; the transparent conductive layer is patterned to form a source electrode that is connected to one terminal of the semiconductor layer via the first through hole and the third through hole and form a drain electrode that is connected to the other terminal of the semiconductor layer via the second through hole and the fourth through hole.

Wherein the step of depositing a transparent conductive layer on the surface of the passivation layer away from the etching stop layer; the transparent conductive layer is patterned to form a source electrode that is connected to one terminal of the semiconductor layer via the first through hole and the third through hole and form a drain electrode that is connected to the other terminal of the semiconductor layer via the second through hole and the fourth through hole further including: depositing a transparent conductive layer on the surface of the passivation layer away from the etching stop layer; the transparent conductive layer is patterned to form source electrode that is connected to one terminal of the semiconductor layer via the first through hole and the third through hole and form a drain electrode that is connected to the other terminal of the semiconductor layer via the second through hole and the fourth through hole; and forming a pixel electrode that is integrally formed with the drain electrode and electrically connected to the drain electrode.

Wherein the steps between the step of depositing an etching stop layer on the surface of the semiconductor layer away from the gate insulating layer and the step of depositing a passivation layer on the surface of the etching stop layer away from the semiconductor layer further including depositing a second metal layer on the surface of the etching stop layer away from the semiconductor layer, and patterning the second metal layer to form a data line.

Wherein the step of separately etching the etching stop layer and the passivation layer corresponding to two terminals of the semiconductor layer to form through holes and expose the two terminals of the semiconductor layer; the first through hole and the second through hole are formed in the etching stop layer corresponding to the two terminals of the semiconductor layer; the third through hole on the passivation layer is corresponding and connect to the first through hole; and the fourth through hole on the passivation layer is corresponding and connect to the second through hole further including separately etching the etching stop layer and the passivation layer corresponding to two terminals of the semiconductor layer to form through holes and expose the two terminals of the semiconductor layer; the first through hole and the second through hole are formed in the etching stop layer corresponding to the two terminals of the semiconductor layer; the third through hole on the passivation layer is corresponding and connect to the first through hole; and the fourth through hole on the passivation layer is corresponding and connect to the second through hole and a fifth through hole is formed in the passivation layer corresponding to the date line.

Wherein the step of depositing a transparent conductive layer on the surface of the passivation layer away from the etching stop layer; the transparent conductive layer is patterned to form a source electrode that is connected to one terminal of the semiconductor layer via the first through hole and the third through hole and form a drain electrode that is connected to the other terminal of the semiconductor layer via the second through hole and the fourth through hole further including depositing a transparent conductive layer on the surface of the passivation layer away from the etching stop layer; the transparent conductive layer is patterned to form a source electrode that is connected to one terminal of the semiconductor layer via the first through hole and the third through hole, the source electrode is electrically connected to the data line via the fifth through hole and form a drain electrode that is connected to the other terminal of the semiconductor layer via the second through hole and the fourth through hole.

The present application further provides a liquid crystal display, wherein the liquid crystal display having a thin film transistor as any of the embodiments described.

The manufacturing method of a thin film transistor of the present application is to deposit the etching stop layer on the surface of the semiconductor layer away from the gate insulating layer. The passivation layer is deposited on the surface of the etching stop layer away from the semiconductor layer. The etching stop layer and the passivation layer corresponding to the two terminals of the semiconductor layer are separately etched to form through holes to expose the two terminals of the semiconductor layer. A transparent conductive layer is deposited on the surface of the passivation layer away from the etching stop layer. The transparent conductive layer is patterned to form the source electrode and a drain electrode. Compared to the conventional technology, after forming the etching stop layer in the manufacturing method of the present application, no mask is needed for metal patterning the etching stop layer, and simply the manufacturing process of forming the thin-film transistor.

BRIEF DESCRIPTION OF THE DRAWINGS

In order to more clearly illustrate the embodiments of the present invention or prior art, the following figures will be described in the embodiments are briefly introduced. It is obvious that the drawings are merely some embodiments of the present invention, those of ordinary skill in this field can obtain other figures according to these figures without paying the premise.

DETAILED DESCRIPTION OF PREFERRED EMBODIMENTS

Embodiments of the present invention are described in detail with the technical matters, structural features, achieved objects, and effects with reference to the accompanying drawings as follows. It is clear that the described embodiments are part of embodiments of the present invention, but not all embodiments. Based on the embodiments of the present invention, all other embodiments to those of ordinary skill in the premise of no creative efforts obtained should be considered within the scope of protection of the present invention.

Specifically, the terminologies in the embodiments of the present invention are merely for describing the purpose of the certain embodiment, but not to limit the invention. Examples and the claims be implemented in the present invention requires the use of the singular form of the book "an", "the" and "the" are intend to include most forms unless the context clearly dictates otherwise. It should also be understood that the terminology used herein that "and/or" means and includes any or all possible combinations of one or more of the associated listed items.

Figure 1:
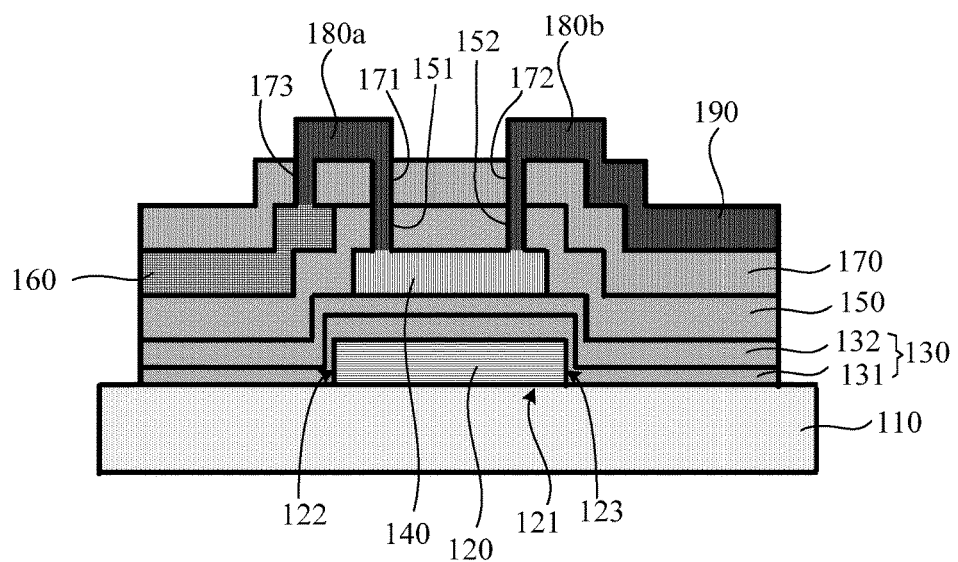
FIG. 1 showing a schematic cross-sectional view of the thin film transistor according to one preferred embodiment of the present application.

Refer to FIG. 1, FIG. 1 showing a schematic cross-sectional view of the thin film transistor according to one preferred embodiment of the present application. The thin film transistor 10 includes a substrate 110, a gate 120, a gate insulating layer 130, a semiconductor layer 140, an etching stop layer 150, a passivation layer 170, a source electrode 180a and a drain electrode 180b. The gate electrode 120 is disposed on a surface of the substrate 110, the gate insulating layer 130 covering the gate electrode 120, the semiconductor layer 140 is disposed on the surface of the gate insulating layer 130 away from the gate electrode 120 and corresponds to the gate electrode 120. The etching stop layer 150 is covering the semiconductor layer 140, and the etching stop layer 150 includes a first through hole 151 and a second through hole 152. The first through hole 151 and the second through hole 152 are set corresponding to the semiconductor layer 140 to expose partial of the semiconductor layer 140, and the first through hole 151 and the second through hole 152 are set in intervals. The passivation layer 170 covers the etching stop layer 150, the passivation layer 170 includes a third through hole 171 and a fourth through hole 172. The third through hole 171 is corresponding to the first through hole 171 and is in communication with the first through hole 151, the fourth through hole 172 is corresponding to the second through hole 152 and is in communication with the second through hole 152. The source electrode 180a is disposed on the passivation layer 170 and connected to one terminal of the semiconductor layer 140 via the first through hole 151 and the third through hole 171. The drain electrode 180b is disposed on the passivation layer 170 and in intervals with the source electrode 180a and connected to the other terminal of the semiconductor layer 140 via the second through hole 152 and the fourth through hole 172.

The substrate 110 is a transparent substrate, the material of the substrate 110 can be selected from one or more than one electrically insulating material such as quartz, mica, aluminum oxide or a transparent plastic material. The substrate 110 as an insulating substrate can reduce the high frequency loss of the substrate 110.

The material of the gate electrode includes but not limited to one or more than one selected from the metal material of Al, Mo, Cu, Ag, Cr, Ti, AlNi, MoTi. In one embodiment, the thickness of the gate electrode 120 is 1500 to 6000 angstroms.

The gate insulating layer 130 includes a first sub-insulation layer 131 and a second sub-insulation layer 132. The first sub-insulation layer 131 covers the gate electrode 120, and the second sub-insulation layer 132 covers the first sub-insulation layer 131. Wherein the first sub-insulation layer 131 includes silicon nitride (SiNx) material, the second sub-insulation layer 132 includes silicon oxide (SiOx) material. The first sub-insulation layer 131 is using a silicon nitride material, in the preparation of silicon nitride material, the hydrogen (H) us generated and be used to repair the semiconductor layer 140, and improving the electrical properties of the semiconductor layer 140. The second sub-insulation layer 132 is provided to improve the stress on the second sub-insulation layer 132 on the semiconductor layer 140, to prevent the peeling of the semiconductor layer 140. In one embodiment, the thickness of the insulator 130 is 1,500 to 4,000 angstroms.

The semiconductor layer 140 is also referred to as a channel layer or an active layer. Preferably, the semiconductor layer 140 is a metal oxide semiconductor layer, the metal oxide semiconductor layer can be selected from one or more following materials but not limited: ZnO-based transparent oxide semiconductor materials, SnO2 transparent oxide group semiconductor materials, In2O3 based transparent oxide semiconductor materials. For example, the semiconductor layer 140 is indium gallium zinc oxide, IGZO.

The etching stop layer 150 can be but not limited to a silicon nitride (SiNx) material, a silicon oxide (SiOx) material, or a silicon oxide or silicon nitride composite material.

The thin film transistor 10 further includes a data line 160. The data line 160 is disposed between the etching stop layer 150 and the passivation layer 170. Accordingly, the passivation layer 170 further includes a fifth through hole 173, the fifth through hole 173 is set corresponding to the data line 160 to expose partial of the data line 160. The data line 160 is electrically connected to the source electrode 180a via the fifth through hole 173.

The gate electrode 120 includes a first surface 121, a second surface 122 and a third surface 123. The first surface 121 is disposed on the substrate 110, and the second surface 122 disposed opposite the third surface 123, the second surface 122 is intersected with the first surface 121, the third surface 123 is intersected with the first surface 121 and the third surface 123 is away from the data line 160 compared to the second surface 122. The surface of the data line 160 adjacent to the third through hole 171 has a gap or coplanar with the second surface 122 of the gate electrode 120. The first surface 121 is disposed on the substrate 110 refers to the first surface 121 of the gate electrode 120 is disposed on the surface of the substrate 110 adjacent to the gate electrode 120, and the first surface 121 and the substrate 110 are coplanar.

Due to the gap or coplanar of the surface of the data line 160 adjacent to the third through hole 171 and the second surface 122 of the gate electrode 120, the data line 160 and the gate electrode 120 are no overlapped. Therefore, the parasitic capacitance between the data lines 160 and the gate electrode 120 is small, so as to achieve the technical effect of decrease the parasitic capacitance 120 between the data lines 160 and the gate electrode 120.

Preferably, the data line 160 is set on the side closer to the first through hole 151 and away from the second through hole 152, and the data line 160 and the first through hole 151 is set in intervals. The fifth through hole 173 is set on the side closer to the third through hole 171 and away from the fourth through hole 172, and the fifth through hole 173 and the third through hole 171 is set in intervals.

Preferably, the fifth through hole 173 is set corresponding to the data line 160 adjacent to the terminal of the third through hole 171.

The material of the passivation layer 170 is selected from but not limited to a silicon nitride (SiNx) material, a silicon oxide (SiOx) material, or a silicon oxide and silicon nitride composite material.

The thin film transistor 10 further comprises a pixel electrode 190. The pixel electrode 190 is disposed on the passivation layer 170. The pixel electrode 190 is electrically connected to the drain electrode 180b and the pixel electrode 190 and the drain electrode 180b is a unitary structure. In one embodiment, the thickness of the pixel electrode 190 is 300-1000 angstroms. The material of the pixel electrode 190 can be but not limited to indium tin oxide, ITO.

The etching stop layer 150 of the thin film transistor 10 in the present application is to cover the semiconductor layer 140. The passivation layer 170 is covering the etching stop layer 150. The source electrode 180*a* and drain electrode 180*b* are disposed on the passivation layer 170, and connected the two terminals of semiconductor layer 140 via the corresponding through holes. Compared to the conventional technology, the etching stop layer 150 of the thin film transistor 10 in the present application is to cover the semiconductor layer 140, therefore, there is no need to pattern the etching stop layer 150 and the source electrode 180*a* and the drain electrode 180*b* are covered in the passivation layer 170. Therefore, the source electrodes 180*a* and drain electrodes 180*b* are relatively away from the etching stop layer 150, it can effectively reduce the damage of the etching solution to the semiconductor layer 140 during the preparation of the source electrodes 180*a* and drain electrodes 180*b*.

Figure 2:
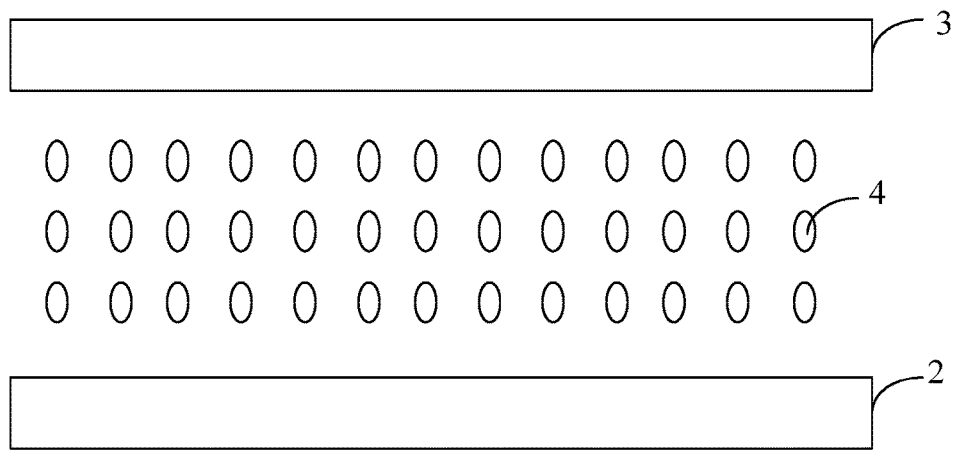
FIG. 2 showing a schematic structure of the liquid crystal panel according to one preferred embodiment of the present application.

A liquid crystal display panel is also provided in the present application. Referring to FIG. 2, FIG. 2 showing a schematic structure of the liquid crystal panel according to one preferred embodiment of the present application. The liquid crystal display panel 1 of the present application includes an array substrate 2, a color filter substrate 3 and a liquid crystal layer 4. The array substrate 2 and the color filter substrate 3 are disposed opposing and apart. The liquid crystal layer 4 is sandwiched between the array substrate 2 and the color filter substrate 3. The array substrate 2 includes a plurality of thin film transistor 10 distributed in array type. For the detail of the transistor 10, please refer to the foregoing description, are not repeat here.

Figure 3:
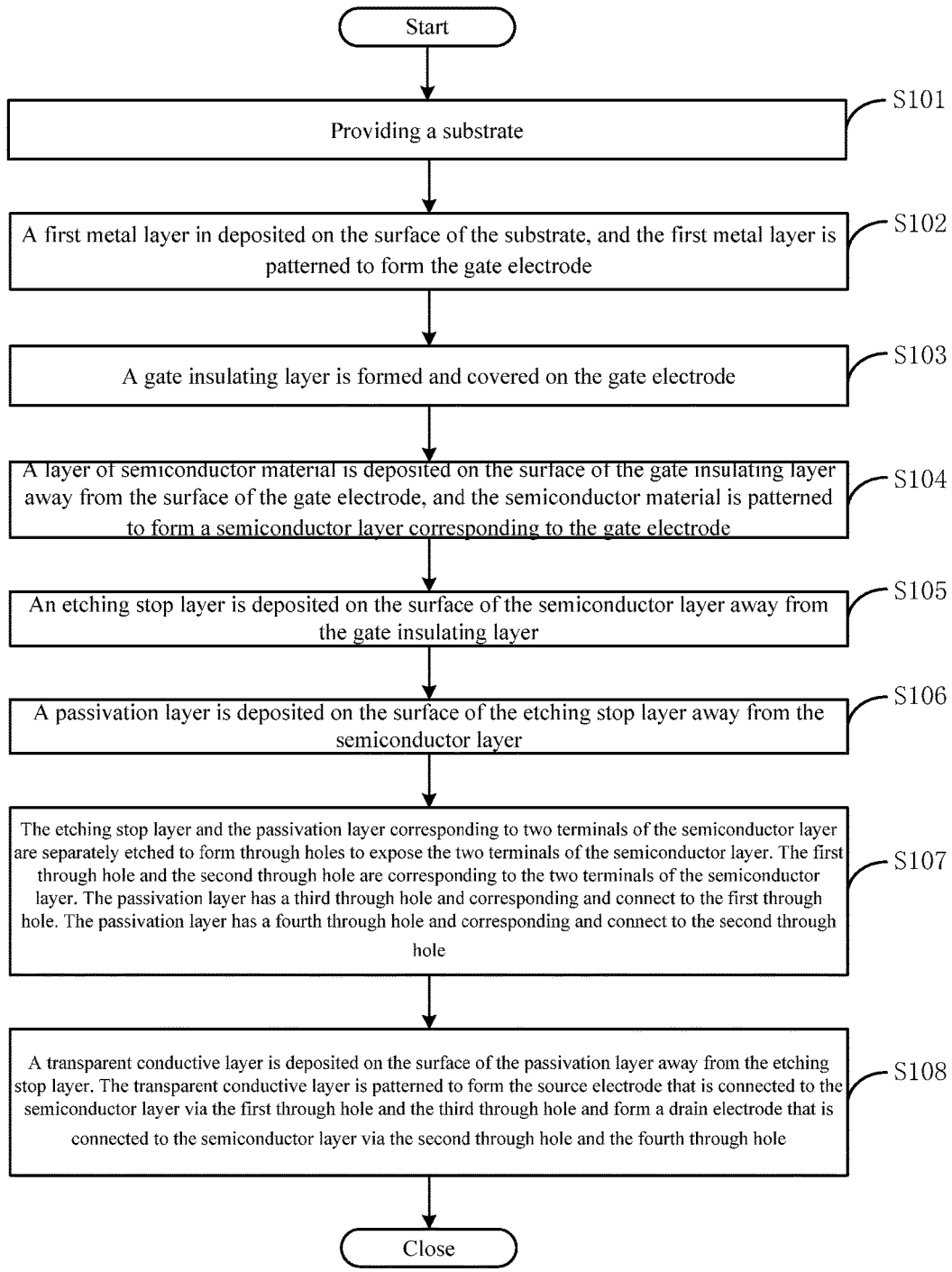
FIG. 3 showing a process flow of the manufacturing method of the thin film transistor according to one preferred embodiment of the present application.

The following description in conjunction with and referring to FIG. 1 for preparing a thin film transistor of the present application will be described. Please also refer to FIG. 3, FIG. 3 showing a process flow of the manufacturing method of the thin film transistor according to one preferred embodiment of the present application. The manufacturing method of the thin film transistor including but not limited to the following steps.

S101: A substrate 110 is provided. The material of the substrate 110 can be selected from one or more than one electrically insulating material such as quartz, mica, aluminum oxide or a transparent plastic material. The substrate 110 as an insulating substrate can reduce the high frequency loss of the substrate 110.

Figure 4:
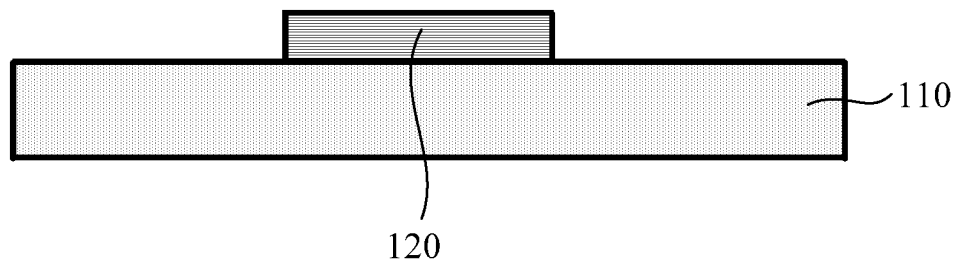
FIG. 4 to FIG. 11 showing schematic structures corresponding to structures in the process of the manufacturing of the thin film transistor of the present application.

S102: A first metal layer in deposited on the surface of the substrate 110, and the first metal layer is patterned to form the gate electrode 120. In particular, referring to FIG. 4, the material of the first metal layer includes but not limited to one or more than one selected from the metal material of Al, Mo, Cu, Ag, Cr, Ti, AlNi, MoTi.

Figure 5:
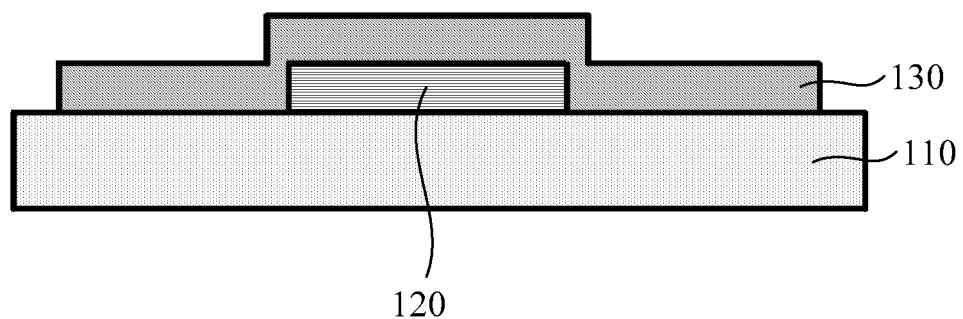

S103: A gate insulating layer 130 is formed on the gate electrode 120 and covered the gate electrode 120. In particular, referring to FIG. 5, the material of the gate insulating layer 130 includes but not limited to silicon nitride (SiNx) material, silicon oxide (SiOx) materials.

Figure 6:
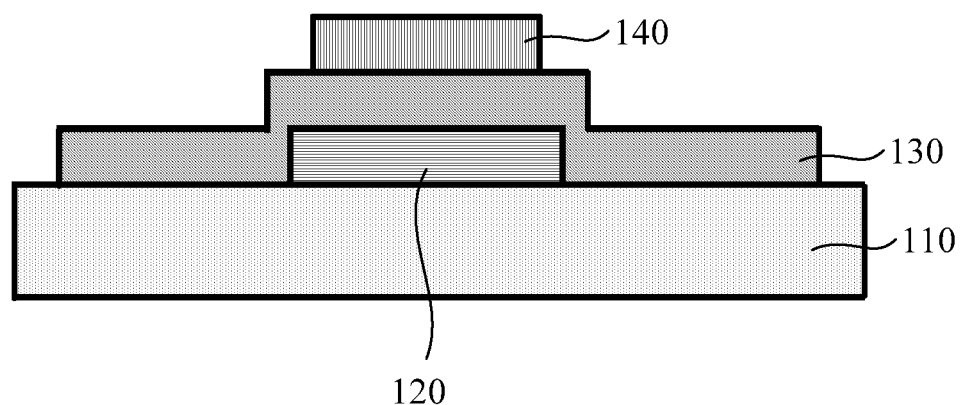

S104: A layer of semiconductor material is deposited on the surface of the gate insulating layer 130 away from the surface of the gate electrode 120. And the semiconductor material is patterned to form a semiconductor layer 140 corresponding to the setting of the gate electrode 120. In particular, referring to FIG. 6, preferably, the semiconductor material is a metal oxide semiconductor material, accordingly, the semiconductor layer 140 is a metal oxide semiconductor layer, the material of the metal oxide semiconductor layer can be selected from one or more following materials but not limited: ZnO-based transparent oxide semiconductor materials, SnO2 transparent oxide group semiconductor materials, In2O3 based transparent oxide semiconductor materials. For example, the semiconductor layer 140 is indium gallium zinc oxide, IGZO.

Figure 7:
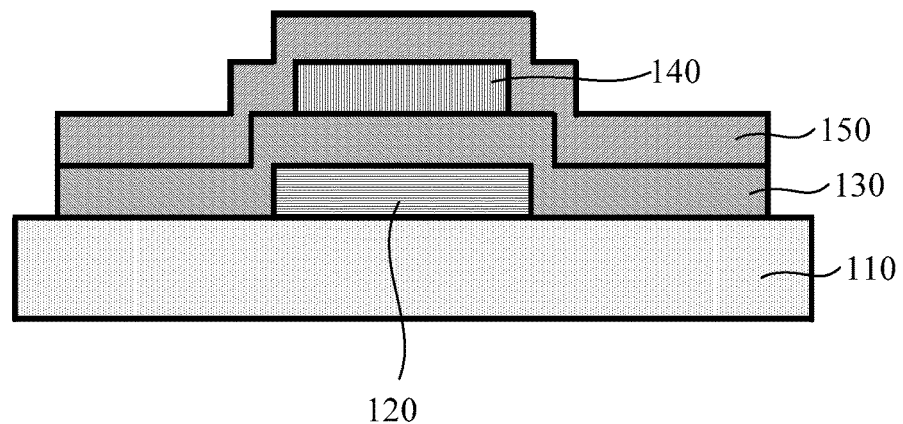

S105: An etching stop layer 150 is deposited on the surface of the semiconductor layer 140 away from the gate insulating layer 130. In particular, referring to FIG. 7, the material of the etching stop layer 150 is but is not limited to a silicon nitride (SiNx) material, a silicon oxide (SiOx) material, a silicon oxide and silicon nitride composite material.

Preferably, between step S105 and step S106, the manufacturing method of the thin film transistor further including a step I, the step I is described in detail below.

Figure 8:
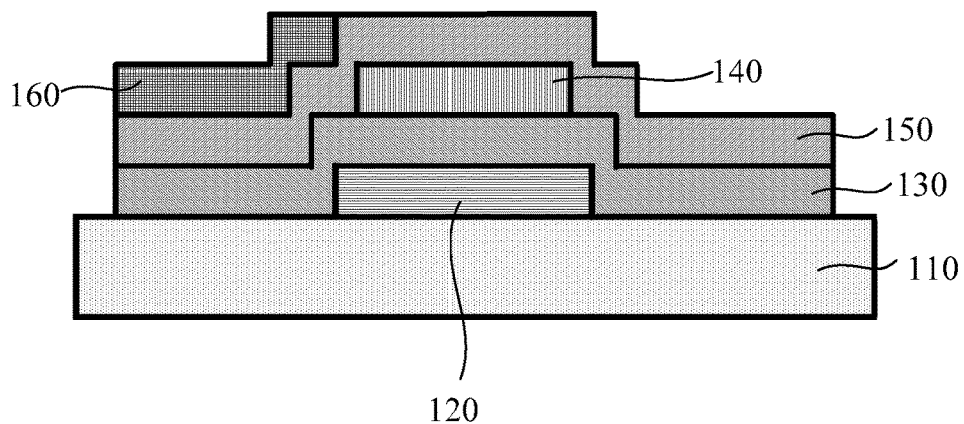

Step I: A second metal layer is deposited on the surface of the etching stop layer 150 away from the semiconductor layer 140, and patterning said second metal layer to form a data line 160. In particular, referring to FIG. 8, the material of the second metal layer includes one or more than one but not limited to, Al, Mo, Cu, Ag, Cr, Ti, AlNi, MoTi or other metal materials.

Figure 9:
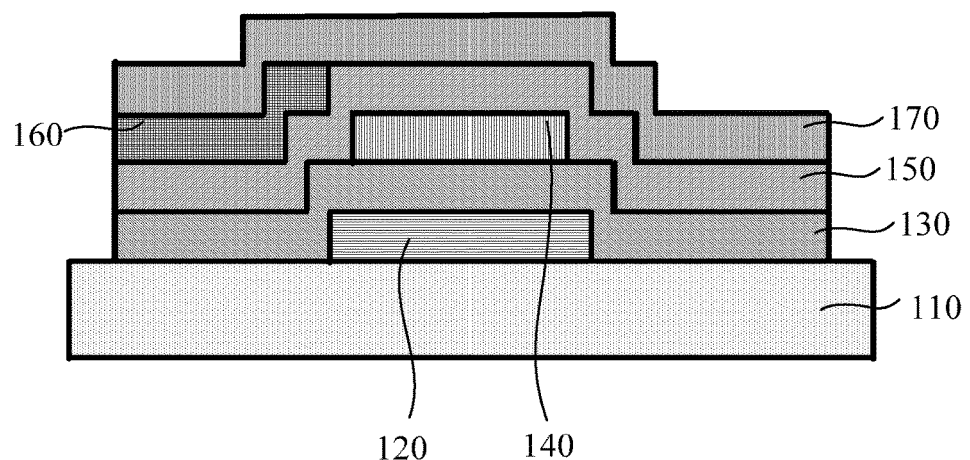

S106: A passivation layer 170 is deposited on the surface of the etching stop layer 150 away from the semiconductor layer 140. In particular, referring to FIG. 9, the material of the passivation layer 170 includes but not limited to a silicon nitride (SiNx) material, a silicon oxide (SiOx) material, or a silicon oxide and silicon nitride composite material.

S107: The etching stop layer 150 and the passivation layer 170 corresponding to two terminals of the semiconductor layer 140 are separately etched to form through holes to expose the two terminals of the semiconductor layer 140. The first through hole 151 and the second through hole 152 are corresponding to the two terminals of the semiconductor layer 140. The passivation layer 170 has a third through hole 171 and corresponding and connect to the first through hole 151. The passivation layer 170 has a fourth through hole 172 and corresponding and connect to the second through hole 152.

Accordingly, the step S107 further includes the step II, the step II is described below in detail.

Figure 10:
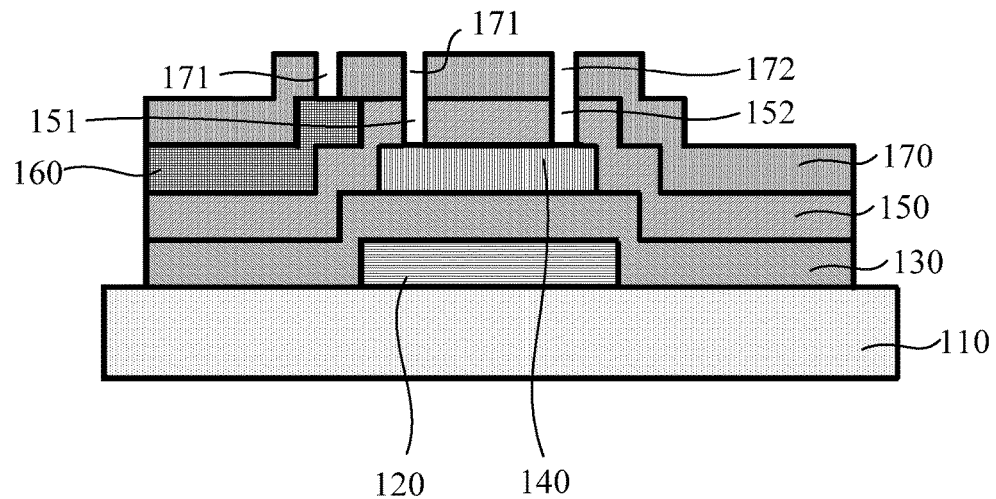

Step II: The etching stop layer 150 and the passivation layer 170 corresponding to two terminals of the semiconductor layer 140 are separately etched to form through holes to expose the two terminals of the semiconductor layer 140. The first through hole 151 and the second through hole 152 are corresponding to the two terminals of the semiconductor layer 140. The passivation layer 170 has a third through hole 171 and corresponding and connect to the first through hole 151. The passivation layer 170 has a fourth through hole 172 and corresponding and connect to the second through hole 152. A fifth through hole 173 in the passivation layer 170 is corresponding to the data line 160. In particular, referring to FIG. 10.

S108: A transparent conductive layer is deposited on the surface of the passivation layer 170 away from the etching stop layer 150. The transparent conductive layer is patterned to form the source electrode 180*a* that is connected to the semiconductor layer 140 via the first through hole 151 and the third through hole 171 and form a drain electrode 180*b* that is connected to the semiconductor layer 140 via the second through hole 152 and the fourth through hole 172.

Preferably, the step S108 specifically includes deposited a transparent conductive layer on the surface of the passivation layer 170 away from the etching stop layer 150. The transparent conductive layer is patterned to form the source electrode 180*a* that is connected to the semiconductor layer 140 via the first through hole 151 and the third through hole 171 and form a drain electrode 180*b* that is connected to the semiconductor layer 140 via the second through hole 152 and the fourth through hole 172. A pixel electrode 190 is integrally formed with the drain electrode 180*b* and is electrically connected to the drain electrode 180*b*.

Accordingly, the step S108 further includes the step III, the step III is described below in detail.

Figure 11:
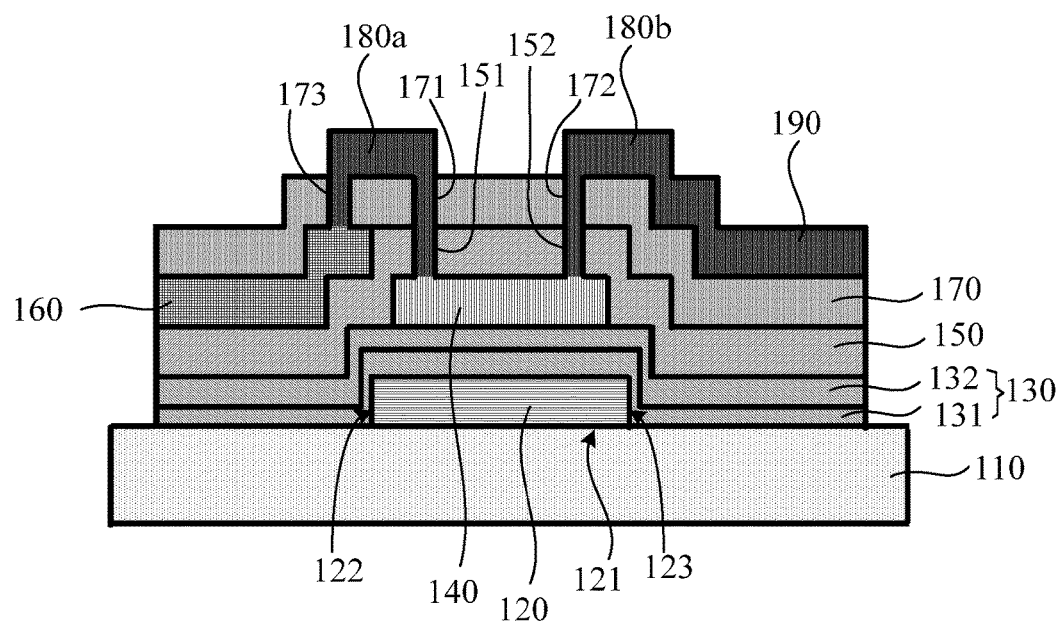

Step III: A transparent conductive layer is deposited on the surface of the passivation layer 170 away from the etching stop layer 150. The transparent conductive layer is patterned to form the source electrode 180*a* that is connected to the semiconductor layer 140 via the first through hole 151 and the third through hole 171. And the source electrode 180*a* is connected to the data line 160 via the fifth through hole 173. And a drain electrode 180*b* is formed and connected to the semiconductor layer 140 via the second through hole 152 and the fourth through hole 172. In particular, referring to FIG. 11.

The manufacturing method of a thin film transistor of the present application is to deposite the etching stop layer 150 on the surface of the semiconductor layer 140 away from the gate insulating layer 130. And the passivation layer 170 is deposited on the surface of the etching stop layer 150 away from the semiconductor layer 140. The etching stop layer 150 and the passivation layer 170 corresponding to the two terminals of the semiconductor layer 140 are separately etched to form through holes to expose the two terminals of the semiconductor layer 140. A transparent conductive layer is deposited on the surface of the passivation layer 170 away from the etching stop layer 150. The transparent conductive layer is patterned to form the source electrode 180*a* and a drain electrode 180*b*. Compared to the conventional technology, after forming the etching stop layer in the manufacturing method of the present application, no mask is needed for metal patterning the etching stop layer, and simply the manufacturing process of forming the thin-film transistor.

Above are embodiments of the present invention, which does not limit the scope of the present invention. Any modifications, equivalent replacements or improvements within the spirit and principles of the embodiment described above should be covered by the protected scope of the invention.

What is claimed is:

1. A thin-film transistor, comprising:
    a substrate;
    a gate electrode formed on the surface of the substrate;
    a gate insulting layer covered on the gate electrode;
    a semiconductor layer disposed on the surface of the gate insulating layer away from the gate electrode and corresponding to the gate electrode;
    an etching stop layer covered the semiconductor layer, and the etching stop layer having a first through hole and a second through hole, wherein the first through hole and the second through hole are set corresponding to the semiconductor layer to expose partial of the semiconductor layer, and the first through hole and the second through hole are set in intervals;
    a passivation layer covered the etching stop layer, the passivation layer having a third through hole and a fourth through hole wherein the third through hole is corresponding to the first through hole and is in communication with the first through hole; the fourth through hole is corresponding to the second through hole and is in communication with the second through hole;
    a source electrode disposed on the passivation layer and connected to one terminal of the semiconductor layer via the first through hole and the third through hole; and
    a drain electrode disposed on the passivation layer and in intervals with the source electrode and connected to the other terminal of the semiconductor layer via the second through hole and the fourth through hole;
    wherein a data line is formed between the etching stop layer and the passivation layer;
    the passivation layer further comprises a fifth through hole formed therein and corresponding to the data line to expose a part of the data line; and
    the part of the data line is electrically connected to the source electrode via the fifth through hole.

2. The thin-film transistor according to claim 1, further comprising a pixel electrode formed on the passivation layer, wherein the pixel electrode is electrically connected to the drain electrode and the pixel electrode is integrally formed with the drain electrode.

3. The thin-film transistor according to claim 1, wherein the gate electrode comprises a first surface, a second surface and a third surface, wherein the first surface is disposed on the substrate; the second surface is disposed opposite to the third surface; the second surface intersects the first surface; the third surface intersects the first surface and the third surface is located further from the data line than the second surface; and the surface of the data line adjacent to the third through hole has a gap or is coplanar with the second surface of the gate electrode.

4. The thin-film transistor according to claim 1, wherein the data line is set on the side closer to the first through hole and away from the second through hole, and the data line and the first through hole is set in intervals; and the fifth through hole is set on the side closer to the third through hole and away from the fourth through hole, and the fifth through hole and the third through hole is set in intervals.

5. The thin-film transistor according to claim 4, wherein the fifth through hole is set on the side closer to the third through hole.

6. A method for manufacturing a thin-film transistor, comprising:
    providing a substrate;
    depositing a first metal layer on the surface of the substrate and pattering the first metal layer to form a gate electrode;
    forming a gate insulating layer on and covering the gate electrode;
    depositing a layer of semiconductor material on the surface of the gate insulating layer away from the surface of the gate electrode, and the semiconductor material is patterned to form a semiconductor layer corresponding to the gate electrode;
    depositing an etching stop layer on the surface of the semiconductor layer away from the gate insulating layer;
    depositing a passivation layer on the surface of the etching stop layer away from the semiconductor layer;
    separately etching the etching stop layer and the passivation layer corresponding to two terminals of the semiconductor layer to form through holes that expose the two terminals of the semiconductor layer, wherein the through holes comprise a first through hole, a second through hole, a third through hole, and a fourth through such that the first through hole and the second through hole are formed in the etching stop layer corresponding to the two terminals of the semiconductor layer; the third through hole is formed in the passivation layer and corresponding and connected to the first through hole; and the fourth through hole is formed in the passivation layer and corresponding and connected to the second through hole; and depositing a transparent conductive layer on the surface of the passivation layer away from the etching stop layer; the transparent conductive layer is patterned to form a source electrode that is connected to one terminal of the semiconductor layer via the first through hole and the third through hole and form a drain electrode that is connected to the other terminal of the semiconductor layer via the second through hole and the fourth through hole;

wherein a step of depositing a second metal layer on the surface of the etching stop layer away from the semiconductor layer and patterning the second metal layer to form a data line is additionally included between the step of depositing an etching stop layer on the surface of the semiconductor layer away from the gate insulating layer and the step of depositing a passivation layer on the surface of the etching stop layer away from the semiconductor layer; and wherein a fifth through hole is formed in the passivation layer and corresponding to the data line such that the source electrode is electrically connected to the data line via the fifth through hole.

7. The method for manufacturing a thin-film transistor according to claim 6, further comprising forming a pixel electrode that is integrally formed with the drain electrode and electrically connected to the drain electrode.

8. A liquid crystal display, wherein the liquid crystal display having a thin film transistor, comprising:
a substrate;
a gate electrode formed on the surface of the substrate;
a gate insulting layer covered on the gate electrode;
a semiconductor layer disposed on the surface of the gate insulating layer away from the gate electrode and corresponding to the gate electrode;
an etching stop layer covered the semiconductor layer, and the etching stop layer having a first through hole and a second through hole, wherein the first through hole and the second through hole are set corresponding to the semiconductor layer to expose partial of the semiconductor layer, and the first through hole and the second through hole are set in intervals;
a passivation layer covered the etching stop layer, the passivation layer having a third through hole and a fourth through hole wherein the third through hole is corresponding to the first through hole and is in communication with the first through hole; the fourth through hole is corresponding to the second through hole and is in communication with the second through hole;
a source electrode disposed on the passivation layer and connected to one terminal of the semiconductor layer via the first through hole and the third through hole; and
a drain electrode disposed on the passivation layer and in intervals with the source electrode and connected to the other terminal of the semiconductor layer via the second through hole and the fourth through hole;
wherein a data line is formed between the etching stop layer and the passivation layer;
the passivation layer further comprises a fifth through hole formed therein and corresponding to the data line to expose a part of the data line; and
the part of the data line is electrically connected to the source electrode via the fifth through hole.

9. The liquid crystal display according to claim 8, wherein the thin film transistor further comprises a pixel electrode formed on the passivation layer, and the pixel electrode is electrically connected to the drain electrode and the pixel electrode is integrally formed with the drain electrode.

10. The liquid crystal display according to claim 8, wherein the gate electrode comprises a first surface, a second surface and a third surface, wherein the first surface is disposed on the substrate; the second surface is disposed opposite to the third surface; the second surface intersects the first surface; the third surface intersects the first surface and the third surface is located further from the data line than the second surface; and the surface of the data line adjacent to the third through hole has a gap or is coplanar with the second surface of the gate electrode.

11. The liquid crystal display according to claim 8, wherein the data line is set on the side closer to the first through hole and away from the second through hole, and the data line and the first through hole is set in intervals; and the fifth through hole is set on the side closer to the third through hole and away from the fourth through hole, and the fifth through hole and the third through hole is set in intervals.

12. The liquid crystal display according to claim 11, wherein the fifth through hole is set on the side closer to the third through hole.

* * * * *